(12) United States Patent
Hoentschel et al.

(10) Patent No.: US 8,673,713 B2
(45) Date of Patent: Mar. 18, 2014

(54) METHOD FOR FORMING A TRANSISTOR WITH RECESSED DRAIN AND SOURCE AREAS AND NON-CONFORMAL METAL SILICIDE REGIONS

(75) Inventors: Jan Hoentschel, Dresden (DE); Uwe Griebenow, Markkleeberg (DE); Andy Wei, Dresden (DE)

(73) Assignee: Advanced Micro Devices, Inc., Sunnyvale, CA (US)

( * ) Notice: Subject to any disclaimer, the term of this patent is extended or adjusted under 35 U.S.C. 154(b) by 309 days.

(21) Appl. No.: 13/080,003

(22) Filed: Apr. 5, 2011

(65) Prior Publication Data

US 2011/0201165 A1    Aug. 18, 2011

Related U.S. Application Data

(62) Division of application No. 12/418,783, filed on Apr. 6, 2009, now abandoned.

(30) Foreign Application Priority Data

Jun. 30, 2008   (DE) .......................... 10 2008 030 854

(51) Int. Cl.
*H01L 21/8238*    (2006.01)
(52) U.S. Cl.
USPC .................................. 438/229; 257/E21.634
(58) Field of Classification Search
USPC .................. 438/229, 683; 257/369, 374, 649, 257/E21.296, E21.634
See application file for complete search history.

(56) References Cited

U.S. PATENT DOCUMENTS

| | | | |
|---|---|---|---|
| 2005/0112817 A1* | 5/2005 | Cheng et al. ................. | 438/219 |
| 2005/0258515 A1* | 11/2005 | Chidambarrao et al. ..... | 257/649 |
| 2005/0269650 A1 | 12/2005 | Pidin | |
| 2006/0043430 A1* | 3/2006 | Feudel et al. ................. | 257/213 |
| 2006/0220113 A1 | 10/2006 | Tamura et al. ................ | 257/335 |
| 2007/0126058 A1 | 6/2007 | Godo et al. ................... | 257/344 |
| 2007/0138570 A1 | 6/2007 | Chong et al. ................. | 257/371 |
| 2008/0038887 A1 | 2/2008 | Chang et al. ................. | 438/230 |
| 2008/0138939 A1 | 6/2008 | Kim ............................. | 438/150 |

FOREIGN PATENT DOCUMENTS

JP    H0684937 A    3/1994

(Continued)

OTHER PUBLICATIONS

Translation of Official Communication from German Patent Office for German Patent Application No. 10 2008 030 854.4 dated May 14, 2009.
"SST Nov. 2007: Intel's evolution: Strained silicon to high-k and metal gate," *Solid State Technology*, Oct. 2007.
Auth et al., "45nm High-k+ Metal Gate Strain-Enhanced Transistors," *2008 Symposium on VLSI Technology Digest of Technical Papers*, Jun. 2008.

(Continued)

*Primary Examiner* — Selim Ahmed (57) ABSTRACT

A non-conformal metal silicide in a transistor of recessed drain and source configuration may provide enhanced efficiency with respect to strain-inducing mechanisms, drain/source resistance and the like. For this purpose, in some cases, an amorphizing implantation process may be performed prior to the silicidation process, while in other cases an anisotropic deposition of the refractory metal may be used.

15 Claims, 7 Drawing Sheets

(56) References Cited

FOREIGN PATENT DOCUMENTS

| | | |
|---|---|---|
| JP | 2001036080 A | 2/2001 |
| JP | 2005353675 A | 12/2005 |
| JP | 2006005544 A | 1/2006 |
| JP | 2007173356 A | 7/2007 |
| JP | 2007524242 A | 8/2007 |
| JP | 2008060408 A | 3/2008 |
| JP | 2008108998 A | 5/2008 |
| JP | 2009076857 A | 4/2009 |
| JP | 2009532861 A | 9/2009 |
| WO | 2007142239 A1 | 12/2007 |

OTHER PUBLICATIONS

Snyder et al., "Analysis of the potential distribution in the channel region of a platinum silicided source/drain metal oxide semiconductor field effect transistor," *Applied Physics Letters*, May 1999.

Thompson et al., "A Logic Nanotechnology Featuring Strained Silicon," *IEEE Electron Device Letters*, Apr. 2004.

Thompson et al., "In Search of 'Forever,' Continued Transistor Scaling One New Material at a Time," *IEEE Transactions on Semiconductor Manufacturing*, Feb. 2005.

PCT Search Report from PCT/US2009/003877 dated Sep. 2, 2009.

\* cited by examiner

METHOD FOR FORMING A TRANSISTOR WITH RECESSED DRAIN AND SOURCE AREAS AND NON-CONFORMAL METAL SILICIDE REGIONS

CROSS-REFERENCE TO RELATED APPLICATION

This is a divisional of application Ser. No. 12/418,783, filed Apr. 6, 2009 now abandoned.

BACKGROUND OF THE INVENTION

1. Field of the Invention

Generally, the subject matter disclosed herein relates to integrated circuits, and, more particularly, to high performance transistors having recessed drain and source regions and strained channel regions by using stress sources, such as stressed overlayers, to enhance charge carrier mobility in the channel region of a MOS transistor.

2. Description of the Related Art

Generally, a plurality of process technologies are currently practiced in the field of semiconductor production, wherein, for complex circuitry, such as microprocessors, advanced storage chips and the like, CMOS technology is currently the most promising approach due to the superior characteristics in view of operating speed and/or power consumption and/or cost efficiency. During the fabrication of complex integrated circuits using CMOS technology, millions of transistors, i.e., N-channel transistors and P-channel transistors, are formed on a substrate including a crystalline semiconductor layer. A MOS transistor, irrespective of whether an N-channel transistor or a P-channel transistor is considered, comprises so-called PN junctions that are formed by an interface of highly doped drain and source regions with an inversely or weakly doped channel region disposed between the drain region and the source region. The conductivity of the channel region, i.e., the drive current capability of the conductive channel, is controlled by a gate electrode formed near the channel region and separated therefrom by a thin insulating layer. The conductivity of the channel region, upon formation of a conductive channel due to the application of an appropriate control voltage to the gate electrode, depends on, among other things, the dopant concentration, the mobility of the majority charge carriers and, for a given extension of the channel region in the transistor width direction, on the distance between the source and drain regions, which is also referred to as channel length. Hence, in combination with the capability of rapidly creating a conductive channel below the insulating layer upon application of the control voltage to the gate electrode, the overall conductivity of the channel region substantially determines the performance of the MOS transistors. Thus, the reduction of the channel length is a dominant design criterion for accomplishing an increase in the operating speed and packing density of the integrated circuits.

The continuing shrinkage of the transistor dimensions, however, involves a plurality of issues associated therewith that have to be addressed so as to not unduly offset the advantages obtained by steadily decreasing the channel length of MOS transistors. One major problem in this respect is providing low sheet and contact resistivity in drain and source regions and any contacts connected thereto and maintaining channel controllability. For example, reducing the channel length may necessitate an increase of the capacitive coupling between the gate electrode and the channel region, which may call for reduced thickness of the gate insulation layer. Presently, the thickness of silicon dioxide based gate insulation layers is in the range of 1-2 nm, wherein a further reduction may be less desirable in view of leakage currents which typically exponentially increase when reducing the gate dielectric thickness. For this reason, in advanced transistor designs, a high-k dielectric material may be used in the gate dielectric layer, possibly in combination with a metal in the gate electrode, to enhance channel controllability and reduce signal propagation delay caused by a high gate resistivity of conventional gate materials, such as polysilicon in combination with a metal silicide.

The continuous size reduction of the critical dimensions, i.e., the gate length of the transistors, necessitates the adaptation and possibly the new development of highly complex process techniques concerning the above-identified problems. It has, therefore, been proposed to improve transistor performance by enhancing the channel conductivity of the transistor elements by increasing the charge carrier mobility in the channel region for a given channel length, thereby offering the potential for achieving a performance improvement that is comparable with the advance to a future technology node while avoiding or at least postponing many of the above-mentioned problems, or achieving further increased performance when combined with other performance enhancing techniques, such as high-k gate dielectrics and the like. One efficient mechanism for increasing the charge carrier mobility is the modification of the lattice structure in the channel region, for instance by creating tensile or compressive stress in the vicinity of the channel region to produce a corresponding strain in the channel region, which results in a modified mobility for electrons and holes, respectively. For example, for standard silicon substrates, creating tensile strain in the channel region increases the mobility of electrons, which in turn may directly translate into a corresponding increase in the conductivity and thus drive current and operating speed. On the other hand, compressive strain in the channel region may increase the mobility of holes, thereby providing the potential for enhancing the performance of P-type transistors. The introduction of stress or strain engineering into integrated circuit fabrication is an extremely promising approach since, for example, strained silicon may be considered as a "new" type of semiconductor material, which may enable the fabrication of fast powerful semiconductor devices without requiring expensive semiconductor materials, while many of the well-established manufacturing techniques may still be used.

According to one promising approach for creating strain in the channel region of transistor elements, the dielectric material that is formed above the basic transistor structure may be provided in a highly stressed state so as to induce a desired type of strain at the transistor and in particular in the channel region thereof. For example, the transistor structures are typically embedded in an interlayer dielectric material, which may provide the desired mechanical and electrical integrity of the individual transistor structures and which may provide a platform for the formation of additional wiring layers, which are typically required for providing the electrical interconnections between the individual circuit elements. That is, a plurality of wiring levels or metallization layers may typically be provided which may include horizontal metal lines and vertical vias including appropriate conductive materials for establishing the electrical connections. Consequently, an appropriate contact structure has to be provided which connects the actual circuit elements, such as transistors, capacitors and the like, or respective portions thereof, with the very first metallization layer. For this purpose the interlayer dielectric material has to be appropriately patterned in order to provide respective openings connecting to the desired contact areas of the circuit elements, which may typically be accomplished by using an etch stop material in combination with the actual interlayer dielectric material.

For example, silicon dioxide is a well-established interlayer dielectric material, in combination with silicon nitride, which may act as an efficient etch stop material during the formation of the contact openings. Consequently, the etch stop material, i.e., the silicon nitride material, is in close contact with the basic transistor structure and thus may efficiently be used for inducing strain in the transistors, in particular as silicon nitride may be deposited on the basis of well-established plasma enhanced chemical vapor deposition (CVD) techniques with high internal stress. For instance, silicon nitride may be deposited with high internal compressive stress of up to 2 GPa and even higher by selecting appropriate deposition parameters. On the other hand, a moderately high internal tensile stress level may be created up to 1 GPa and higher by appropriately adjusting the process parameters, for instance, in particular, the degree of ion bombardment during the deposition of the silicon nitride material. Consequently, the magnitude of the strain created in the channel region of a transistor element may depend on the internal stress level of the dielectric etch stop material and the thickness of stressed dielectric material in combination with the effective offset of the highly stressed dielectric material with respect to the channel region. Consequently, in view of enhancing transistor performance, it may be desirable to increase the internal stress level and also provide increased amounts of highly stressed dielectric material in the vicinity of the transistor element, while also positioning the stressed dielectric material as closely as possible to the channel region.

It turns out, however, that the internal stress levels of silicon nitride material may be restricted by the overall deposition capabilities of presently available plasma enhanced CVD techniques, while also the effective layer thickness may be substantially determined by the basic transistor topography and the distance between neighboring circuit elements. Consequently, although providing significant advantages, the efficiency of the stress transfer mechanism may significantly depend on process and device specifics and may result in reduced performance gain for well-established standard transistor designs having gate lengths of 50 nm and less, since the given device topography and the gap fill capabilities of the respective deposition process, in combination with a moderately high offset of the highly stressed material from the channel region caused by sophisticated spacer structures, may reduce the finally obtained strain in the channel region.

For these reasons, it has been suggested to use a recessed transistor architecture, i.e., an architecture in which portions of the drain and source regions are recessed with respect to the channel region, at least a top surface thereof, when two-dimensional transistor configurations are considered in the vicinity of the interface between the channel region and the gate insulation layer, in order to enable the deposition of the highly stressed dielectric material at a lower height level compared to non-recessed configuration, thereby efficiently enhancing the lateral stress transfer mechanism into the channel region since the internal stress of the dielectric material may also be applied in a lateral direction and may not only be restricted to the surface area of the semiconductor material. Moreover, in addition to in principle enhancing the overall stress transfer mechanism, the recess formed in the drain and source regions may also provide an increased surface area that is available for a silicidation process, which is typically applied in order to reduce the overall series resistance within the drain and source regions. In advanced transistor elements, typically a plurality of strain-inducing mechanisms may be used, such as a strained semiconductor material that may be embedded in the drain and source regions of, for example, P-channel transistors in which, for instance, a silicon/germanium alloy may provide a strained state in the drain and source regions, which may also induce a compressive strain in the channel region. Furthermore, contact elements may be formed on the basis of deposition recipes in which a moderately high internal stress level may also be generated, which may also be advantageously used to enhance transistor performance. Consequently, a delicate combination of various influences obtained by strain-inducing mechanisms, the size and shape of the recesses in combination with the metal silicide may thus determine the overall drive current capability of the transistors. For example, although an increased amount of metal silicide may be advantageous in view of enhancing the conductivity of the basic silicon material, the quality of the metal silicide for a given material composition, such as cobalt silicide, nickel silicide, nickel platinum silicide and the like, and the distance of the metal silicide with respect to the channel region and the like may have to be taken into consideration in view of the mutual dependencies with other performance enhancing mechanisms when adjusting the overall transistor characteristics. For example, although a reduced distance of the metal silicide with respect to a channel region may per se be considered as being advantageous, in a strained channel configuration, an increased degree of strain may overcompensate for a slight local reduction of the series resistance, which may be achieved by reducing the distance between the metal silicide and the channel region. That is, by positioning the metal silicide closer to the channel region, a certain reduction of the strain transfer may also be observed, since the metal silicide may act as a buffer material and thus as a resistance with respect to stress propagation into the channel region. Consequently, a reduced electrical resistance may possibly be overcompensated for by an increased "stress transfer resistance," thereby resulting in a reduced performance gain as would be expected when considering each of the performance enhancing mechanisms independently. In other cases, when, for instance, a silicon/germanium material may be incorporated in the drain and source regions, the metal silicide positioned close to the channel region may consume strained silicon/germanium material, thereby also reducing the efficiency thereof, which may also result in a less pronounced performance gain, thereby rendering respective manufacturing techniques, such as epitaxial growth techniques and the like, less efficient, while nevertheless requiring significant efforts in terms of cycle time and thus overall production costs.

The present disclosure is directed to various methods and devices that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure relates to techniques and semiconductor devices in which drain and/or source resistance in recessed transistor configurations may be enhanced by adapting a thickness profile of a metal silicide layer formed on exposed surface portions of a recessed drain region and/or source region. Contrary to conventional strategies for forming metal silicide regions, in which a substantially uniform layer thickness and thus a substantially conformal metal silicide layer may be provided in the drain and source regions, the present disclosure contemplates a non-conformal silicidation process, at least in one of the drain and source regions of at least one type of transistor, thereby enabling a reduction of the metal silicide thickness at substantially vertical surface portions within the recess, while nevertheless maintaining a desired increased thickness at substantially horizontal portions, i.e., at the bottom of the recesses. Consequently, an overall increased area for accepting charge carriers from the channel regions may still be provided, thereby reducing the resistance for "spreading" the drain/source current while, on the other hand, the thickness and thus the distance of metal silicide from the channel region in the vicinity of the gate insulation layer may be reduced. Consequently, a reduced influence of the metal silicide on other strain-inducing mechanisms, such as a stressed dielectric material formed within the recess, embedded semiconductor alloys and the like, may be achieved so that, in combination, an enhanced overall transistor performance may be accomplished. In some illustrative aspects disclosed herein, a non-conformal formation of metal silicide may be achieved by "non-conformally" modifying the crystalline structure of the recessed drain and/or source areas, for instance by performing an ion implantation process, thereby providing an enhanced diffusion of metal and silicon during the corresponding process, so that the reaction rate may be adjusted on the basis of implantation parameters, which may thus be controlled with high accuracy. Consequently, a high degree of flexibility may be provided in appropriately adapting the local thickness of the metal silicide layer within the recesses, which may thus enable a gradual adaptation of transistor characteristics. In other illustrative aspects disclosed herein, the non-conformal metal silicide may be obtained on the basis of the highly anisotropic deposition recipe for providing the refractory metal, which may then result in a corresponding non-conformal layer thickness.

One illustrative semiconductor device disclosed herein comprises a transistor comprising drain and source regions connecting to a channel region, wherein the drain region and/or the source region has a recessed configuration and comprises a metal silicide layer having a non-conformal thickness. The semiconductor device further comprises a stress-inducing dielectric layer that is in contact with the metal silicide layer.

One illustrative method disclosed herein comprises forming a recess in a drain region and/or a source region of a transistor. Moreover, a metal silicide layer is formed in a non-conformal manner in the recess and finally a strain-inducing layer is formed above the drain and source regions.

A still further illustrative method disclosed herein comprises forming a recess in a drain region and/or a source region of a transistor. Furthermore, an ion implantation process is performed to modify an exposed area of the drain region and/or source region in the recess in a non-conformal manner. The method further comprises depositing a metal above the drain and source regions and performing a heat treatment to create a metal silicide in a non-conformal manner within the recess.

BRIEF DESCRIPTION OF THE DRAWINGS

The disclosure may be understood by reference to the following description taken in conjunction with the accompanying drawings, in which like reference numerals identify like elements, and in which:

FIG. 1*l* schematically illustrates the semiconductor device according to still further illustrative embodiments in which a selective ion implantation process may be performed in order to provide non-conformal metal silicide regions in one type of transistor and a substantially conformal metal silicide in other types of transistors.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Generally, the present disclosure provides semiconductor devices and techniques for forming the same, in which a recessed configuration may be realized in MOS transistors, that is, in planar transistor configurations, a portion of the metal silicide formed in the drain and source regions may be positioned below a height level as defined by an interface between the gate insulation layer and the channel region of the transistor. In three-dimensional transistor configurations, such as FinFETs, tri-gate transistors and the like, a recessed transistor configuration is to be understood as a transistor architecture in which at least a portion of the metal silicide in the drain and source areas may be positioned below a height level of a top surface of a corresponding fin, in which the fully depleted channel builds up during transistor operation. Furthermore, in the context of the present disclosure, a recessed transistor configuration is to be understood as a transistor in which the drain region or the source region, or both, comprise a portion of metal silicide that is positioned below the interface of the gate insulation layer and the channel region or positioned below a top surface of a corresponding fin in a three-dimensional transistor architecture. According to the principles disclosed herein, enhanced transistor performance may be accomplished in a recessed configuration by forming a non-conformal metal silicide layer in at least one of the drain and source regions, thereby providing the potential for appropriately adjusting the overall transistor characteristics so that advantages of the recessed configuration with respect to reducing series resistance and generally enhancing overall stress transfer may be maintained, while at the same time a certain degree of mobility degradation, which may be associated with conventional recessed transistor configurations, may be reduced by appropriately adapting the thickness of the metal silicide immediately adjacent to the channel region. For example, in the recessed configuration, a substantially vertically extending surface area of the drain and/or source regions may receive a moderately thin metal silicide so as to not unduly reduce the efficiency of any other stress-inducing sources, such as a highly stressed dielectric material provided in the recess, a semiconductor alloy, the stress created by the contact elements and the like, whereas a moderately thick metal silicide may be provided at horizontal surface portions of the recess, thereby maintaining the overall series resistance at a low level. Consequently, due to the increased surface area including a metal silicide, the "spreading" resistance, i.e., the resistance for connecting to the channel region of the transistor, may be reduced due to the generally increased surface area, while nevertheless the "shielding" effect of the amount of metal silicide positioned in close proximity to the channel region may be reduced. Consequently, in N-channel transistors, generally, a reduced source/drain junction resistance may be accomplished wherein generally enhanced performance may be obtained by providing the non-conformal metal silicide thickness on the basis of an amorphizing ion implantation, which may generally result in enhanced quality of the resulting metal silicide. Moreover, enhanced electron mobility and thus drive current may be obtained compared to conventional recessed configurations due to the enhanced stress transfer of a tensilely stressed dielectric material formed in the recess and possibly in combination with a tensile stress created by contact elements. On the other hand, the efficiency of the stress transfer is enhanced, as explained above. Similarly, for P-channel transistors, the recessed configuration may also be advantageous in that metal silicide may be positioned more closely to the channel region compared to planar transistor configurations and also a dielectric cap layer may be formed within the recess while at the same time the enhanced stress transfer may be accomplished, as discussed above. In particular, in combination with an embedded silicon/germanium alloy and the like, a reduced degree of material consumption may be accomplished by providing the non-conformal metal silicide, while still reducing the spreading resistance in the drain and source regions.

Figure 1A:
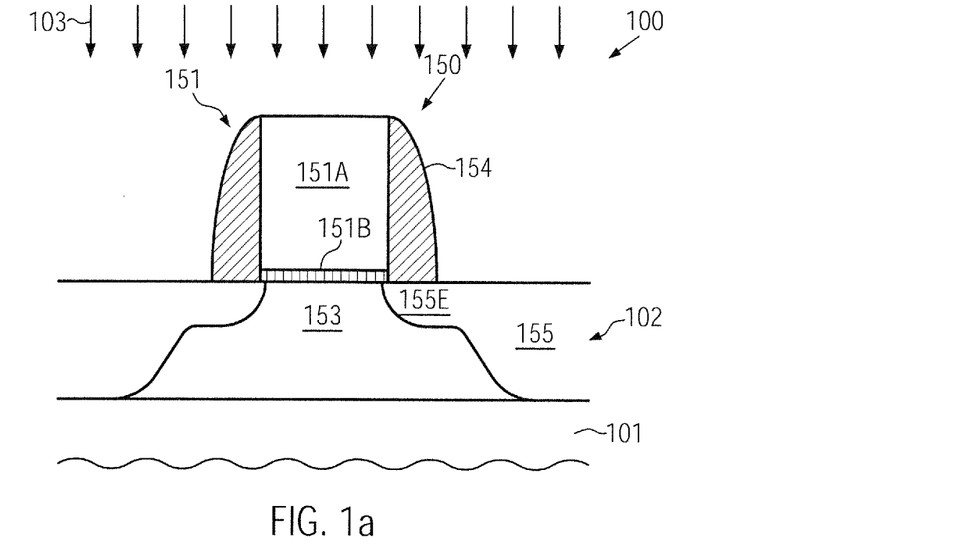
FIGS. 1*a*-1*f* schematically illustrate cross-sectional views of a semiconductor device including a transistor receiving a recessed drain and source configuration during various manufacturing stages in which a metal silicide may be provided in a non-conformal manner by using a lattice-damaging ion implantation process, according to illustrative embodiments.

FIG. 1a schematically illustrates a cross-sectional view of a semiconductor device 100 comprising a substrate 101, above which may be formed a semiconductor material 102, for instance a silicon-based semiconductor material, for which electronic characteristics, such as charge carrier mobility, may be locally adjusted on the basis of stress-inducing techniques, as also discussed above. The substrate 101 may represent any appropriate carrier material for forming thereabove the semiconductor material 102, such as a silicon substrate, an insulating substrate and the like. In some illustrative embodiments (not shown), the substrate 101, in combination with the semiconductor material 102, may represent a silicon-on-insulator (SOI) configuration in which a buried insulating layer (not shown) may be positioned between the semiconductor material 102 and the substrate 101. In other cases, the semiconductor material 102 may represent an upper portion of a substantially crystalline semiconductor material of the substrate 101 or at least a portion thereof. In this manner, a bulk configuration may be defined, i.e., a configuration in which a thickness of the semiconductor material 102 may be significantly greater compared to a typical depth of transistor active areas provided in the semiconductor layer 102. In still other cases, the semiconductor device 100 may comprise SOI areas and bulk areas at different device regions, depending on the overall requirements for the device 100. Furthermore, in the manufacturing stage shown, the semiconductor device 100 may comprise a transistor 150 comprising a gate electrode structure 151 including a gate electrode material 151A and a gate insulation layer 151B, which separates the gate electrode material 151A from a channel region 153 that is formed in the semiconductor material 102. The gate electrode material 151A may be comprised of polysilicon, metal-containing materials and the like, depending on the overall device configuration. Similarly, the gate insulation layer 151B may be provided in the form of a silicon dioxide-based dielectric, or any other appropriate dielectric material, which may comprise a high-k dielectric material, which is to be understood as a dielectric material having a dielectric constant of approximately 10.0 or higher. In other cases, the gate electrode structure 151 may represent a place holder structure which may be replaced by a sophisticated gate electrode structure, for instance comprising metal-containing materials in combination with high-k dielectrics. Furthermore, the gate electrode structure 151 may have formed on sidewalls thereof a spacer structure 154. Additionally, drain and source regions 155 may be formed in the semiconductor layer 102, wherein, depending on the transistor characteristics, a more or less pronounced dopant profile may be established wherein, for instance, so-called extension regions 155E may define an effective channel length of the region 153. It should be appreciated that, in FIG. 1a, the transistor 150 may have a symmetric configuration so that the drain and source regions may be distinguished upon operation of the transistor 150, while, in other cases, an asymmetric dopant profile may be provided for the drain and source regions, for instance an increased overlap of the extension region 155E at the source side may be provided, if deemed appropriate, while a reduced overlap or non-overlap may be provided in the drain region in order to reduce undue gate leakage and the like.

The semiconductor device 100 as shown in FIG. 1a may be formed on the basis of the following processes. Prior to or after defining an appropriate base doping of respective regions of the semiconductor layer 102, for instance in order to define N-channel transistors and P-channel transistors, respective isolation structures, such as trench isolations and the like (not shown), may be formed. Thereafter, the gate electrode structure 151 may be provided, for instance by forming a gate dielectric material followed by the deposition of an appropriate gate electrode material or place holder material, which may include other materials, for instance intermediate etch stop layers, anti-reflecting coating (ARC) layers or any other cap layers, which may be required by the corresponding process strategy. For example, in some cases, a cap layer (not shown) may be provided on top of the gate electrode material 151A and may be maintained throughout the entire manufacturing sequence and may be used as an etch mask for avoiding undue material removal of the gate electrode material 151A during an etch process 103 for forming corresponding recesses in the drain and/or source regions. The patterning of the gate electrode structure 151 may be accomplished on the basis of any appropriate techniques, including sophisticated lithography and etch techniques. Next, the extension regions 155E may be defined by an appropriate implantation sequence, which may include halo implants, amorphization implants and the like, in combination with the introduction of the required N-type dopant species or P-type dopant species, depending on the conductivity type of the transistor 150. For this purpose, the spacer structure 154 may be formed to provide an offset spacer (not shown) in order to maintain a desired offset of the extension region 155E in order to adjust the desired effective channel length 153. Thereafter, the spacer structure 154, that is, individual spacer elements, possibly in combination with etch stop liners (not shown), may be formed and appropriately designed implantation processes may be performed in order to obtain the desired overall lateral dopant profile, the shape of which may be adjusted on the basis of subsequent anneal techniques in which the dopant species may be activated to a certain degree and also implantation-induced damage may be re-crystallized. As previously discussed, in sophisticated manufacturing regimes, additional strain-inducing mechanisms may be implemented, for instance a semiconductor material may be embedded in the drain and source areas 155, for instance by forming cavities or recesses after patterning the gate electrode structure 151, and refilling the cavities or recesses with an appropriate strain-inducing semiconductor material.

For example, for P-channel transistors, a silicon/germanium alloy with a germanium content of up approximately 30 atomic percent may provide a moderately high strain component, which may also be efficiently transferred into the channel region 153. In other cases, one or more of the anneal processes performed for re-crystallizing the drain and source areas may be performed in the presence of an appropriate rigid material, which may also be provided with a high internal stress level, if desired, so that the re-growth of the previously highly damaged drain and source areas, or other areas which may have previously been amorphized, may take place in a strained state, which may even be maintained, at least to a certain degree, after the partial or complete removal of the overlying cap layer. Respective techniques may also be referred to as stress memorization techniques and may enable a moderately high strained state, in particular in N-channel transistors, the effect of which may also be higher in combination with the non-conformal metal silicide creation, as will be described later on. Consequently, after providing the basic transistor configuration, the etch process 103 may be performed, for instance on the basis of well-established etch recipes, in which silicon material or silicon-containing material may be efficiently removed selectively with respect to the spacer structure 154. In the embodiment shown in FIG. 1a, a portion of the gate electrode material 151A may also be removed during the etch process 103, while, in other cases, when a corresponding material removal may not be compatible with overall process strategy, a cap layer may be maintained in the top surface of the gate electrode material 151A, such as a silicon nitride layer, as previously discussed.

Figure 1B:
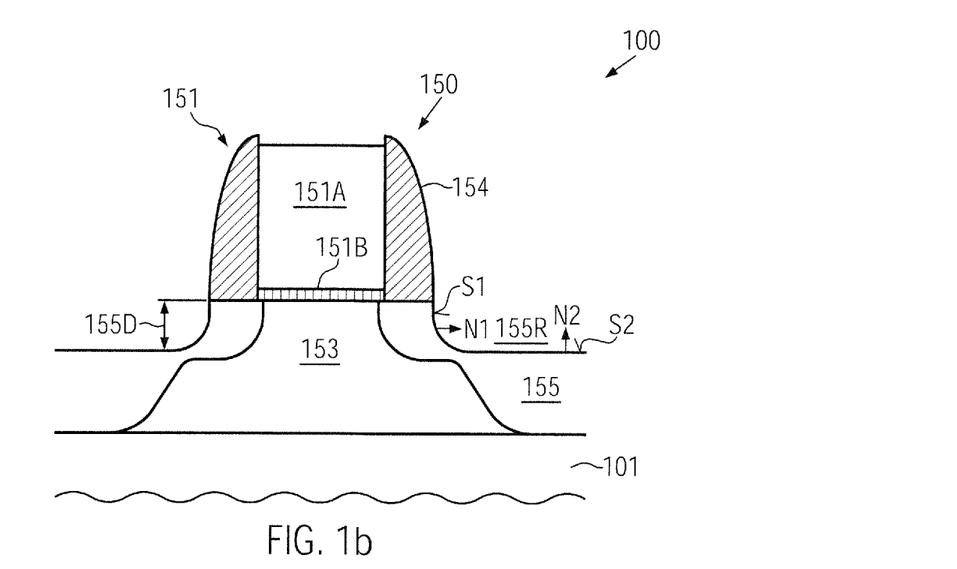

FIG. 1b schematically illustrates the semiconductor device 100 after the etch process 103. As illustrated, recesses 155R are formed in the drain and source regions 155 with a size and shape that may be adapted on the basis of the process parameters of the etch process 103. That is, for a given parameter setting of the etch process 103, that is, for a given etch rate, a depth 155D of the recess 155R may be adjusted on the basis of the etch time, while an offset of the recess 155R with respect to the channel region 153 may be defined by the width of the spacer structure 154. In some illustrative embodiments, a substantially anisotropic etch recipe may be used, thereby providing a well-defined offset which may thus be defined by the spacer width 154. Consequently, the recess 155R may comprise a substantially vertical surface portion S1, that is, a surface portion including a surface normal N1 that may be oriented substantially in the direction of current flow or in the direction of the transistor length, i.e., in FIG. 1b, the horizontal direction, while another surface portion S2 determined by a surface normal N2 may be considered as a substantially horizontal portion, in which the surface normal N2 is oriented substantially perpendicular to the channel length direction.

Figure 1C:
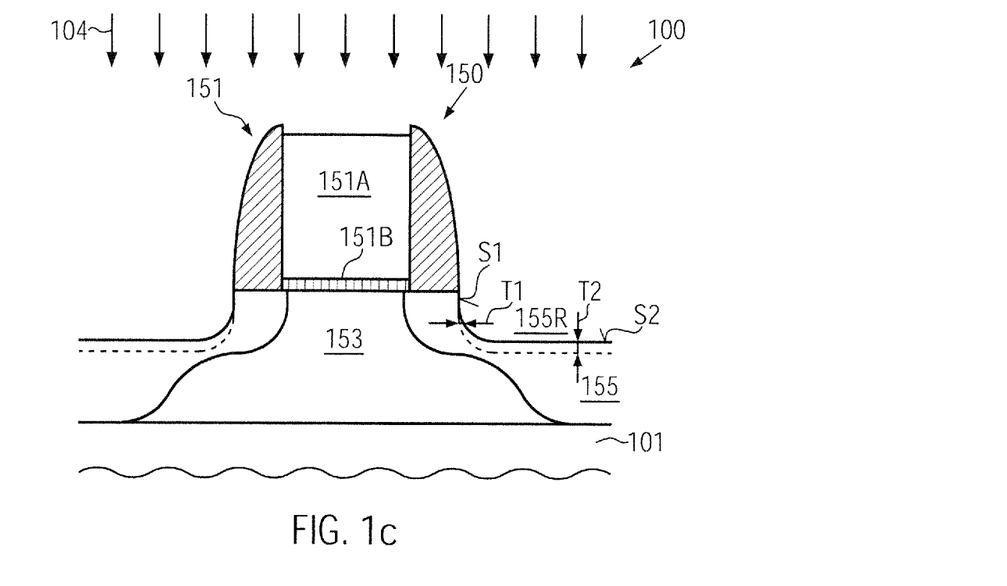

FIG. 1c schematically illustrates the semiconductor device 100 in an advanced manufacturing stage in which exposed portions of the drain and source regions, i.e., the surface of the recesses 155R and the gate electrode material 151A, may be prepared for a subsequent silicidation process. In the embodiment shown, an implantation process 104 may be performed to create significant crystalline damage or provide a substantially amorphized area in the exposed portions of the drain and source regions 155. For example, ionic species, such as silicon, germanium and the like, may be used during the implantation process 104, wherein implantation parameters, such as energy and dose, may be appropriately selected in order to obtain a desired degree of lattice damage. Corresponding parameter settings may readily be established on the basis of simulation, test runs and the like. It should be appreciated that pre-amorphization implantations may frequently be used in stress memorization techniques, as discussed above, and also in the process sequence for forming the drain and source extension regions 155E (FIG. 1a). In other cases, xenon may be used as an efficient implantation species which may provide heavy crystalline damage at moderately low implantation dose values, thereby reducing overall cycle time. In the embodiment shown, a substantially perpendicular ion beam may be used during the process 104, thereby providing a highly non-conformal modification of exposed portions of the drain and source regions 155. That is, due to the substantially non-tilted ion beam, a thickness T1 of a damaged zone in the surface area S1 may be less than a thickness T2 of the damaged zone corresponding to the surface S2. Consequently, the heavy crystalline damage or the substantially amorphized state may result in a different degree of diffusion of a metal, which may be provided in a later manufacturing stage so as to form a metal silicide. Consequently, a corresponding diffusion process may also propagate in a non-conformal manner corresponding to the various thicknesses T1, T2 of the damage zones in the drain and source regions 155. It should be appreciated that the size and shape of the damaged zone may be efficiently adjusted on the basis of the parameters of the implantation process 104, i.e., on the basis of a tilt angle, which may be varied from zero to any appropriate value, by energy and dose for a predetermined ionic species and the like, as will also be described later on in more detail.

Figure 1D:
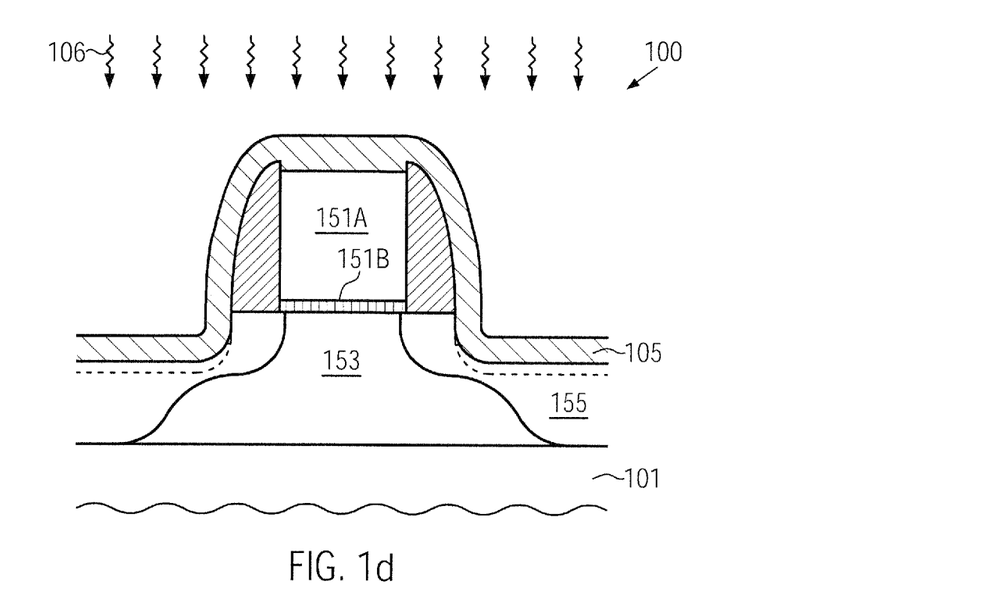

FIG. 1d schematically illustrates the semiconductor device 100 in an advanced manufacturing stage in which a layer of refractory metal 105 may be formed in the transistor 150. The metal layer 105 may comprise any appropriate material, such as nickel, cobalt, nickel platinum and the like as may be required for the desired type of metal silicide. The layer 105 may be formed on the basis of well-established deposition techniques, such as sputter deposition and the like, in which process parameters may be adjusted on the basis of deposition temperature, pressure, bias voltage and the like. In the embodiment shown in FIG. 1d, a substantially conformal deposition behavior may be used for forming the layer 105. It should be appreciated that, prior to the deposition of the layer 105, other processes, such as clean processes and the like, may be performed in accordance with well-established process strategies in order to appropriately prepare the exposed surface portions for receiving the metal layer 105. Thereafter, a heat treatment 106 may be performed to initiate a chemical reaction of the metal in the layer 105 and silicon in the gate electrode material 151A and the drain and source regions 155. Due to the previously formed damage on the basis of the process 104, the silicidation may progress in a non-conformal manner according to the shape of the damaged zone according to the non-conformal thickness thereof, such as the thickness T1 and T2 (FIG. 1c) so that the metal of the layer 105 may be converted in a non-conformal manner into a metal silicide. Thereafter, any non-reactive material may be removed on the basis of well-established selective etch techniques and, if required, any further heat treatments, for instance for stabilizing the resulting metal silicide, forming a highly conductive compound of metal silicide and the like, may be used.

Figure 1E:
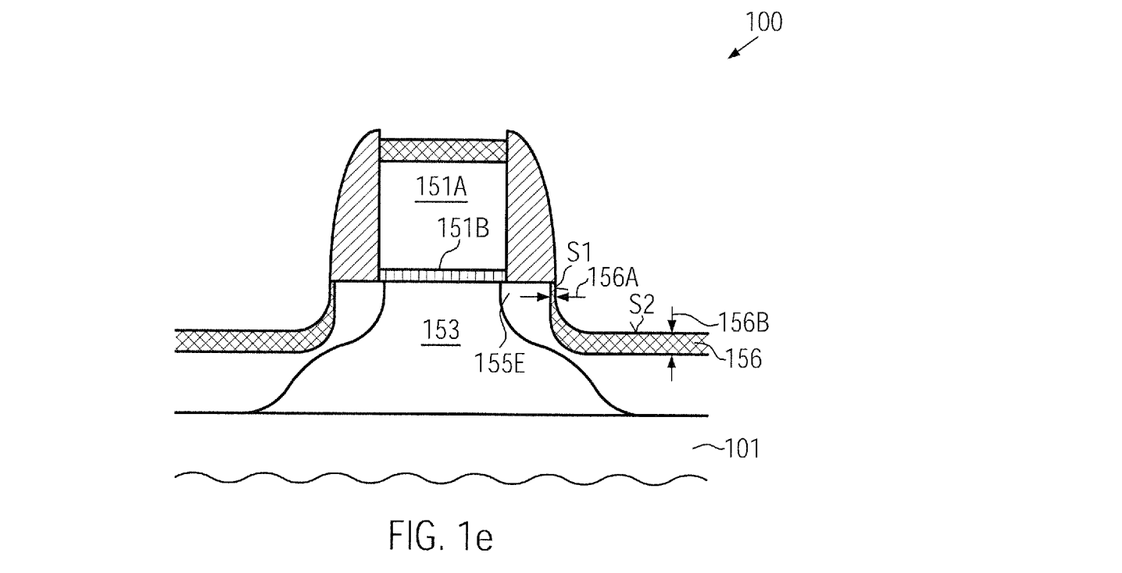

FIG. 1e schematically illustrates the semiconductor device 100 after the above-described process sequence. As illustrated, a metal silicide 156 comprising the metal of the layer 105 is formed in a non-conformal manner, i.e., a thickness 156A of the metal silicide at the surface area S1 may be significantly less compared to a thickness 156B corresponding to the surface area S2. Thus, the substantially vertically oriented metal silicide corresponding to the surface area S1 may consume a significantly less pronounced amount of material of the remaining drain and source extension regions 155E and may thus maintain any strain level created therein, for instance by previously provided strain-inducing material, such as a strained material obtained by stress memorization techniques, while in other cases the extension regions 155E may comprise a strained semiconductor alloy, as previously discussed. On the other hand, the surface area S1 provides an increased area for charge carrier collection from the channel region 153 via the extension region 155E, thereby reducing the overall series resistance, while the increased thickness at the substantially horizontal portion of the metal silicide 156 may provide the reduced contact resistance.

Figure 1F:
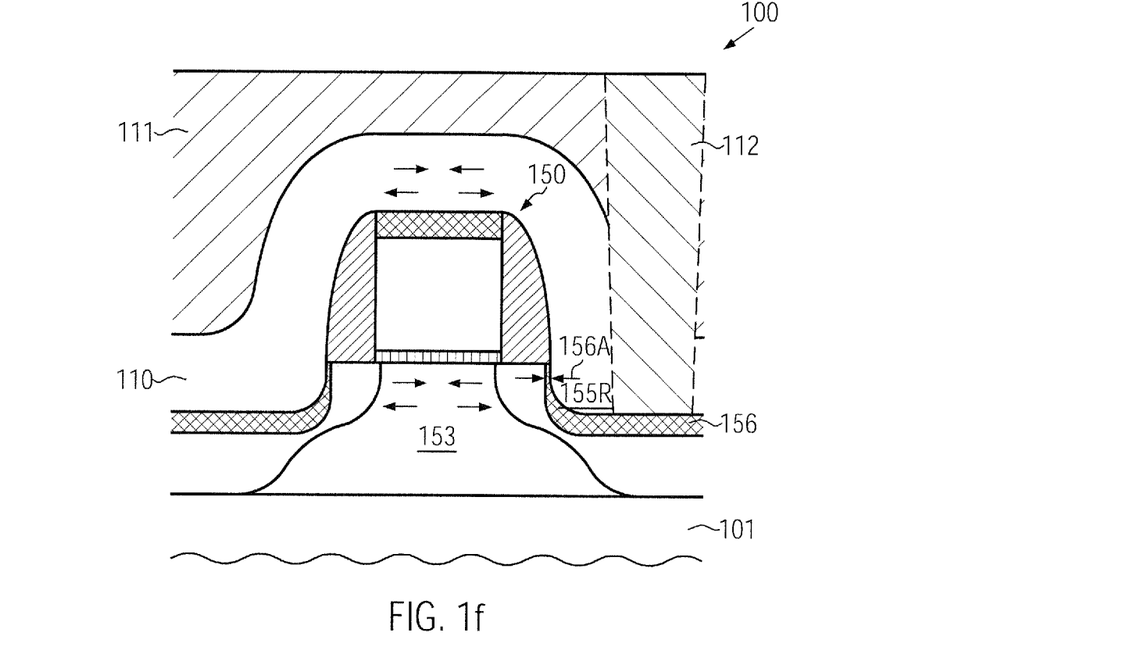

FIG. 1f schematically illustrates the semiconductor device 100 in a further advanced manufacturing stage in which a stressed dielectric material 110 may be formed on or above the transistor 150 and thus also within the recess 155R. The dielectric material 110 may represent any appropriate material, such as silicon nitride material, nitrogen-containing silicon carbide and the like, which may have a high internal stress level as may be required for enhancing charge carrier mobility in the channel region 153, as previously discussed. The material 110 may be formed on the basis of well-established deposition recipes, such as plasma enhanced CVD using appropriate process parameters, while in other cases a plurality of individual layers may be sequentially deposited in order to obtain moderately low permittivity of the material of the layer 110, while nevertheless providing a high internal stress level. Consequently, due to the recess 155R, a corresponding stress component may also efficiently act in a lateral direction, thereby providing a highly efficient strain-inducing mechanism, wherein the reduced thickness 156A may not unduly "interrupt" the stress transfer. Thus, a moderately high tensile or compressive strain may be obtained, depending on the internal stress level of the layer 110. That is, for N-channel transistors, a tensile stressed material may be used, while for P-channel transistors, a compressively stressed material may be used. Thereafter, an interlayer dielectric material 111, such as silicon dioxide and the like, may be deposited on the basis of well-established recipes. Next, the surface topography may be planarized and contact openings may be formed so as to connect to the drain and/or source regions 155, i.e., to the corresponding metal silicide 156, and the corresponding contact openings may be filled with an appropriate metal so as to provide contact elements 112. In some cases, the filling in of a metal into the contact openings may be accomplished on the basis of appropriately selected deposition parameters in order to create a desired type of stress in the contact elements 112. For example, a tensile stress component may be accomplished by appropriately setting parameters, such as pressure, temperature, gas flow rates during a CVD process for depositing a tungsten material in accordance with well-known techniques.

Figure 1G:
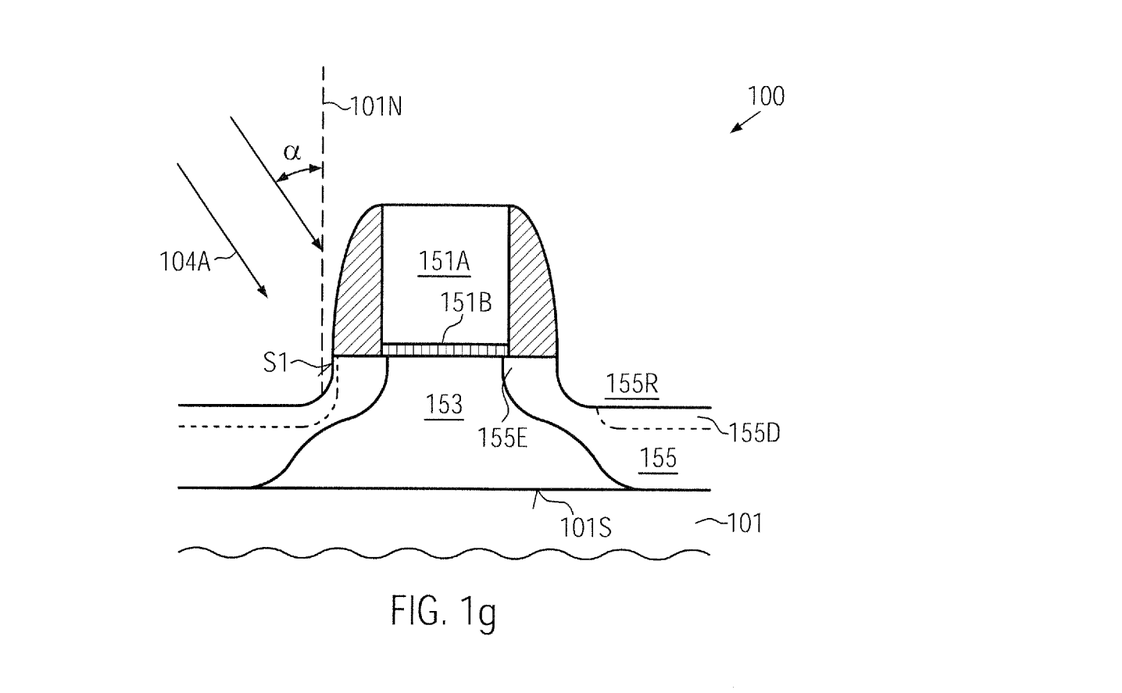
FIG. 1*g* schematically illustrates the semiconductor device according to further illustrative embodiments in which a selective adaptation of the degree of non-conformality may be accomplished by varying implantation parameters.

FIG. 1g schematically illustrates the semiconductor device 100 according to illustrative embodiments in which, after forming the recess 155R, an implantation process 104A may be performed to modify the damaged zones 155D by using a tilt angle α, at least during a certain phase of the entire implantation process 104A. In this respect, a tilt angle is to be understood as a non-zero angle with respect to a surface normal 101N of a surface 101A of the substrate 101. By selecting an appropriate tilt angle, possibly in combination with an adapted implantation energy and dose, there is a high degree of flexibility in adjusting the size and shape of the damaged zones 155D individually for the drain and source regions 155. For example, in FIG. 1g, it may be assumed that the source region is at the left-hand side and may require an increased thickness at vertical surface area S1. By using a corresponding tilt angle of approximately 5-10 degrees, the ion beam may be blocked at the right-hand side, which may be assumed to be the drain region 155, thereby correspondingly reducing the damaging effect during the implantation 104A. It should be appreciated, however, that the process 104A may also include a substantially non-tilted implantation step so as to provide a reduced damage zone in the surface portion S1 of the drain region 155, similarly as is described above with reference to FIGS. 1a-1f. Consequently, by varying at least one of the implantation parameters, the size and shape of the finally obtained metal silicide regions 156 (not shown) may be adapted in accordance with the overall device requirements. It should be appreciated that a degree of non-conformality, for instance obtained by using a tilt angle, may be applied in a symmetric manner using a tilt angle from both sides, while in other cases an asymmetric configuration as shown in FIG. 1g may be used. Thereafter, the further processing may be continued, as described above.

Figure 1H:
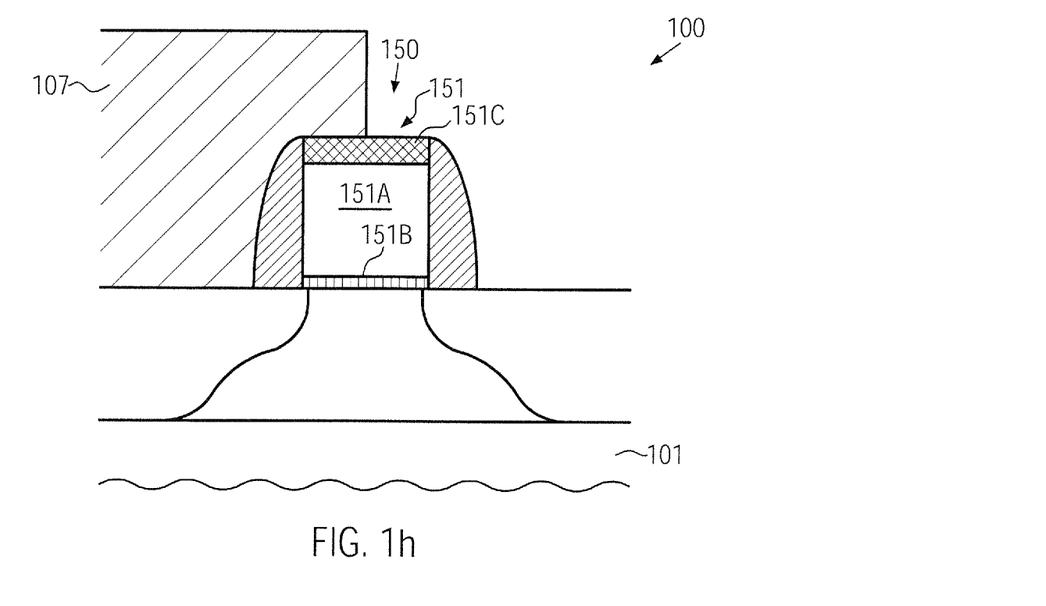
FIGS. 1*h*-1*i* schematically illustrate cross-sectional views of a semiconductor device in which a transistor element may receive an asymmetric configuration with respect to a recessed drain and source configuration, in combination with a non-conformal metal silicide, according to still other illustrative embodiments.

FIG. 1h schematically illustrates the semiconductor device 100 according to further illustrative embodiments in which an asymmetric configuration may be achieved with respect to forming the recesses 155R. For this purpose, an etch mask 107 may be provided, for instance in the form of silicon nitride, silicon dioxide and the like, possibly in combination with a cap layer 151C for protecting the gate electrode material 151A. The cap layer 151C may be provided during the patterning of the gate electrode structure 151, as previously discussed. After forming the basic transistor configuration, as shown in FIG. 1h, the mask layer 107 may be provided by means of lithography, in which other transistors (not shown) as well as one side of the transistor 150 may be covered.

Figure 1I:
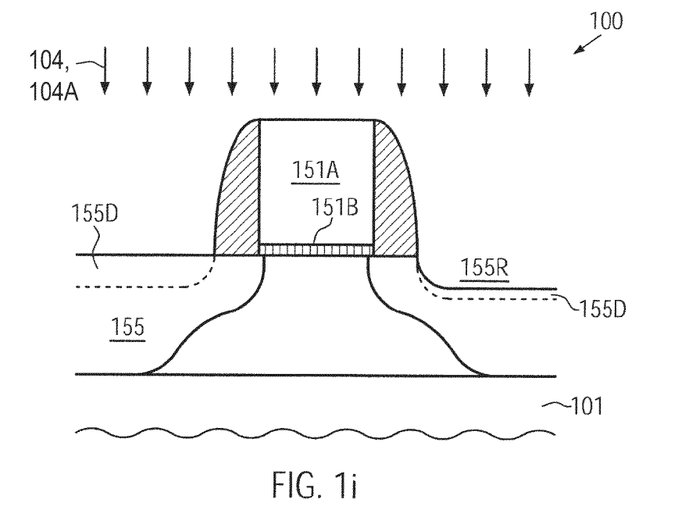

FIG. 1i schematically illustrates the semiconductor device 100 in a further advanced manufacturing stage. As illustrated, a recess 155R is selectively formed in one of the drain and source regions 155. Moreover, the mask 107 is removed, possibly in combination with a cap layer 151C, depending on the overall process strategy. Furthermore, the device 100 is exposed to the ion bombardment 104 or 104A, as previously described. Consequently, the damaged zone 155D in the recessed drain and source region may be provided with a non-conformal shape, while the damaged zone and the non-recessed drain and source region 155 may be provided in a substantially conformal manner. Consequently, during the further processing of the device 100, the desired non-conformal metal silicide may be formed at the right-hand side, while substantially conformal and planar metal silicide configurations may be obtained at the right-hand side.

Figure 1J:
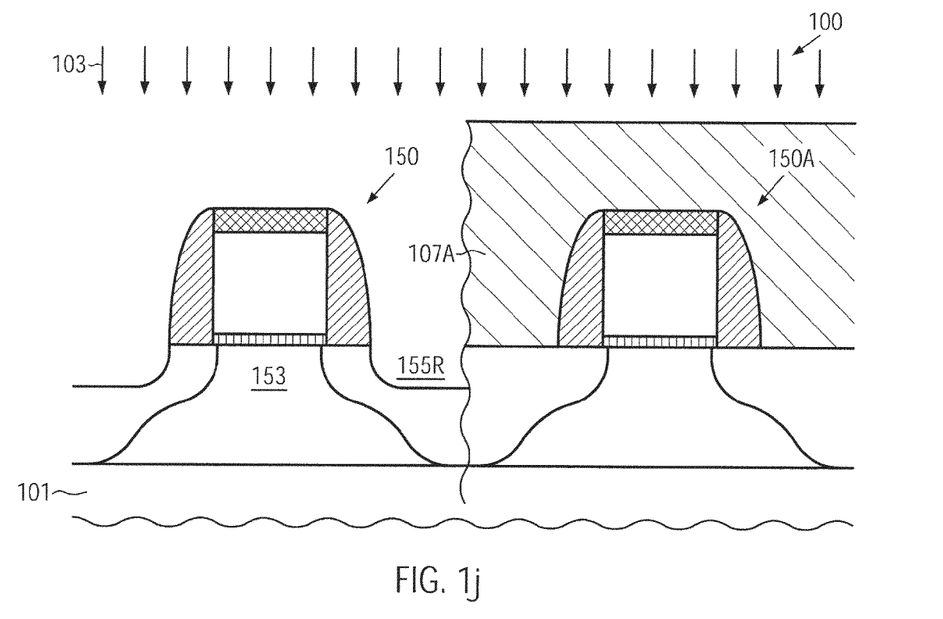
FIGS. 1*j*-1*k* schematically illustrate cross-sectional views of the semiconductor device according to still further illustrative embodiments in which one transistor may receive a recessed configuration based on a non-conformal metal silicide while the other transistor may represent a planar configuration.

FIG. 1j schematically illustrates the semiconductor device 100 which may comprise a second transistor 150A, which is shown to have substantially the same configuration as the transistor as shown in FIG. 1a, wherein it should be appreciated that the transistor 150A may represent any transistor which may not require a recessed metal silicide region. For example, the transistor 150A may represent a different conductivity type, for which overall device performance may be higher without providing a recessed configuration, for instance due to a desired lower strain level in the channel region 153 and the like. Moreover, an etch mask 107A is added to cover the transistor 150A, while exposing the transistor 150 to the etch ambient 103, as previously described. Consequently, the recesses 155R may be selectively formed in the transistor 150.

Figure 1K:
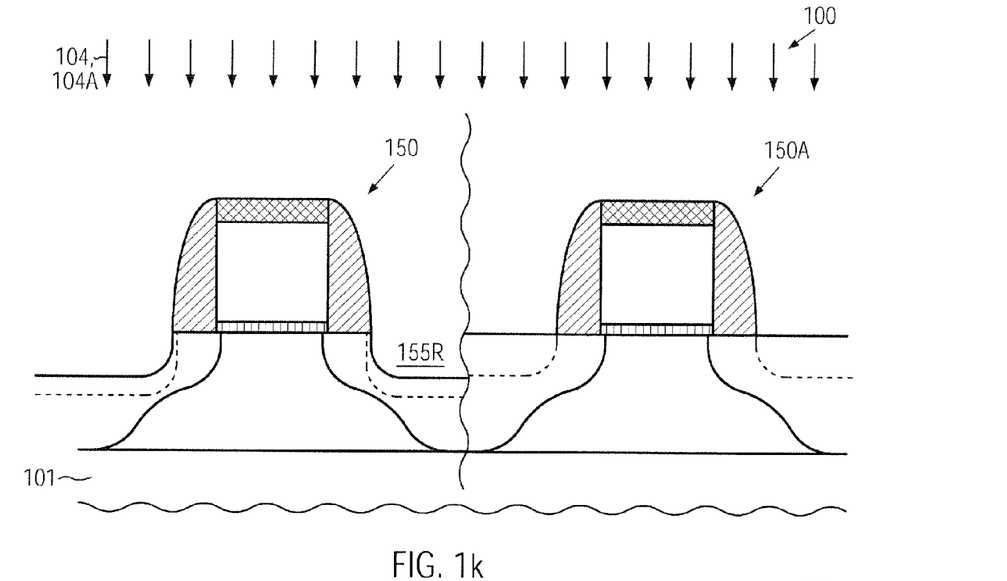

FIG. 1k schematically illustrates the semiconductor device 100 after the removal of the etch mask 107A and during an ion implantation process 104, 104A, depending on the desired configuration of the metal silicide regions in the transistor 150. That is, a tilted or non-tilted implantation sequence may be performed, depending on the compatibility of a tilted implantation for the transistor 150A. Thereafter, the further processing may be continued as previously described in order to obtain a non-conformal metal silicide in the transistor 150 while providing a substantially conformal metal silicide layer in the transistor 150A.

FIG. 1l schematically illustrates the semiconductor device 100 according to further illustrative embodiments in which a recessed configuration may be provided for both transistors 150, 150A, while, however, a non-conformal metal silicide region may be formed in the transistor 150. To this end, after performing the corresponding etch process 103 (FIG. 1j) for both transistors 150, 150A, an implantation mask 107B may be formed, for instance as a resist mask, to cover the transistor 150A during the ion implantation process 104, 104A. Consequently, the non-conformal damaged zones 155D may be selectively formed in the transistor 150, while a conventional silicidation process may be performed in the transistor 150A during the subsequent processes. It should be appreciated that the degree of non-conformal layer thickness of the damaged zones 155D in the transistor 150 may be appropriately adapted, as previously explained, for instance by providing a modified symmetric adapted profile, for instance by using symmetric tilt angles, or by providing an asymmetric configuration, depending on the overall device requirements. Thereafter, the further processing may be continued, as previously described.

Consequently, a high degree of flexibility may be provided by the embodiment described above so as to appropriately position and shape the damaged zones 155D in order to control the actual silicidation process. Thus, a recessed configuration may be selectively provided in order to obtain the advantages associated with the recessed configuration while also reducing the shielding effect corresponding to the surface areas S1, while in other cases still a certain degree of stressed components, which may be induced by the metal silicide itself, for instance in the form of a compressive stress component, may be maintained at the portion corresponding to the surface area S2. Moreover, by appropriately selecting the process parameters for the implantation processes 104, 104A, the degree of non-conformal thickness of the metal silicide and any degree of asymmetry with respect to drain and source regions of the same transistor or with respect to different transistors may readily be obtained on the basis of corresponding masking regimes, as described above.

Figure 2A:
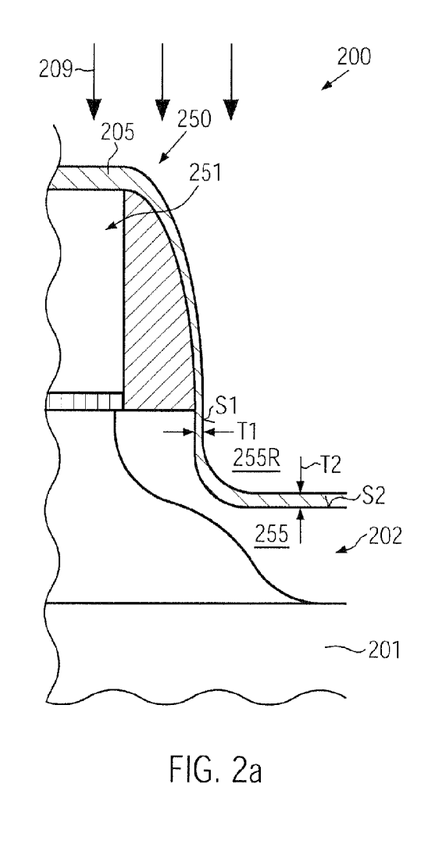
FIGS. 2*a*-2*b* schematically illustrate cross-sectional views of a semiconductor device during a silicidation sequence for forming a non-conformal metal silicide on the basis of an anisotropic deposition technique, according to still other illustrative embodiments.
Figure 2B:
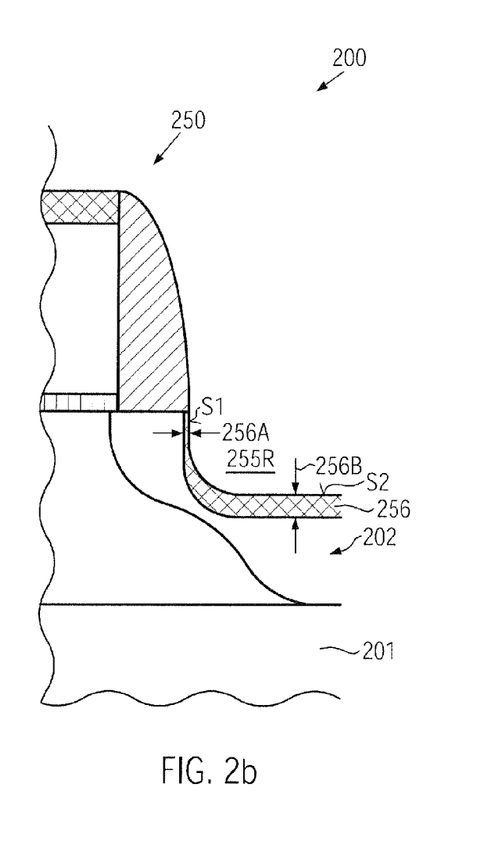

With reference to FIGS. 2a-2b, further illustrative embodiments will now be described in which a non-conformal progression of the silicidation process may be accomplished by providing the metal layer in a non-conformal manner.

FIG. 2a schematically illustrates a semiconductor device 200 corresponding to a portion of a transistor 250. The device may comprise a substrate 201, a semiconductor layer 202, in which may be formed drain and source regions 255 in a recessed configuration and a gate electrode structure 251 may be provided. For these components, the same criteria apply as previously explained with reference to the device 100. Moreover, in the manufacturing stage shown, a metal layer 205, which may comprise any appropriate material for forming a metal silicide, as specified above, is formed above the transistor 250 and within the recess 255R. A thickness of the layer 205 may vary in a non-conformal manner so as to provide a different thickness T1 at a surface portion S1, which may be less than a thickness T2 of the layer 205 formed on a surface portion S2. For example, the thickness T1 may be approximately less than half of the thickness T2, while other values between T1 and T2 may be adjusted on the basis of process parameters of a deposition process 209. As previously indicated, the deposition of a refractory metal may be formed on the basis of well-established process techniques, such as sputter deposition, CVD and the like, wherein at least in some deposition techniques, such as sputter deposition, process parameters may be adjusted such that a different deposition rate may be generated, depending on an angle of a corresponding surface normal. For instance, temperature and pressure during the deposition process 209, possibly in combination with a bias voltage, if applied, may result in an enhanced degree of directionality, that is, corresponding particles may move preferably in a substantially perpendicular direction with respect to the substrate 201. Hence, the deposition rate on horizontal surface portions may be greater compared to substantially vertical surface portions, such as the surface area S1.

FIG. 2*b* schematically illustrates the semiconductor device 200 in a further advanced manufacturing stage in which a non-conformal metal silicide region 256 may be provided, which has a reduced thickness 256A corresponding to the surface area S1 and an increased thickness 256B at a position corresponding to the surface area S2.

The metal silicide 256 may be formed on the basis of process techniques as previously described, i.e., a heat treatment may be performed in which a difference in thickness of the layer 205 (FIG. 2*a*) results in a different amount of silicon that may be consumed by the silicidation process. Thereafter, the non-reactive material may be moved, for instance from the dielectric portions, and any further heat treatments for stabilizing or adjusting the overall characteristics of the metal silicide 256 may be performed. Thereafter, the further processing may be continued on the basis of similar process techniques, as previously described.

Hence, also in this case, the non-conformal metal silicide 256 may provide a reduced negative effect on any strain-inducing mechanisms, such as stress memorization techniques, embedded semiconductor alloys, highly stressed dielectric materials to be formed in the recess 255R and the like.

As a result, the present disclosure provides techniques and semiconductor devices in which at least one of the drain and source regions may have a non-conformal metal silicide region in order to enhance overall device performance, for instance by not reducing using the effect of strain-inducing mechanisms, such as dielectric cap layers, strained drain and source areas, which may be formed by stress memorization techniques, embedded semiconductor alloys and the like, stressed contact materials and the like. It should be appreciated that the principles disclosed herein may also be readily applied to three-dimensional transistor configurations, such as FinFETS, tri-gate transistors and the like, wherein a portion of the metal silicide may be recessed with respect to a top surface of a corresponding channel region wherein also in this case a reduced strain relaxing effect of at least a portion of the metal silicide may be accomplished.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed is:

1. A method, comprising:
   forming a first recess in at least one of a drain region and a source region of a transistor; wherein said first recess comprises a first surface portion and a second surface portion that is substantially normal to said first surface portion;
   forming a second recess in the other one of said drain region and said source region wherein said second recess comprises a third surface portion and a fourth surface portion that is substantially normal to said third surface portion;
   generating crystal damage in said first and second surface portions of said first recess, wherein a depth of said crystal damage in said first surface portion is substantially less than a depth of said crystal damage in said second surface portion;
   after generating crystal damage in said first and second surface portions of said first recess, forming a first non-conformal metal silicide layer in said first recess having a first thickness at said first surface portion and a second thickness at said second surface portion, wherein said first thickness is substantially less than said second thickness;
   forming a second non-conformal metal silicide layer in said second recess having a third thickness at said third surface portion and a fourth thickness at said fourth surface portion, wherein said third thickness is substantially less than said fourth thickness, wherein said first thickness is substantially different than said third thickness and said second thickness is substantially different than said fourth thickness; and
   forming a strain-inducing layer above said drain and source regions.

2. The method of claim 1, wherein generating crystal damage comprises performing an ion implantation process.

3. The method of claim 2, wherein said ion implantation process comprises an implantation using a non-zero tilt angle.

4. The method of claim 1, wherein forming said first non-conformal metal silicide layer comprises depositing a non-conformal metal layer above said transistor and initiating a chemical reaction between said non-conformal metal layer and a silicon material of said drain and source regions.

5. A method, comprising:
   forming a first recess in at least one of a drain region and a source region of a first transistor and a second recess in at least the other of the drain region and the source region;
   performing an ion implantation process to modify an exposed area of said at least one of a drain region and a source region in said first recess;
   depositing a metal above said drain and source regions; and
   performing a heat treatment to create a non-conformal metal silicide within said first recess and said second recess, wherein a thickness of said non-conformal metal silicide at a first surface portion of said first recess is less than a thickness of said non-conformal metal silicide at a second surface portion of said first recess and wherein a thickness of said non-conformal metal silicide at a third surface portion of said second recess is less than a thickness of said non-conformal metal silicide at a fourth surface portion of said second recess, wherein said thickness of said non-conformal metal silicide at said first surface portion is substantially different than said thickness of said non-conformal metal silicide at said third surface portion and said thickness of said non-conformal metal silicide at said second surface portion is substantially different than said thickness of said non-conformal metal silicide at said fourth surface portion;
   wherein said first recess is formed in the drain region and a further recess is formed in the source region and wherein said ion implantation is performed asymmetrically with respect to said drain and source regions.

6. The method of claim 5, further comprising forming a strain-inducing layer above said drain and source regions.

7. The method of claim 5, wherein performing an ion implantation process comprises using a non-zero tilt angle.

8. The method of claim 5, further comprising masking a second transistor prior to performing said implantation process.

9. The method of claim 8, wherein said second transistor comprises a second recess in at least one of a drain region and a source region of said second transistor.

10. The method of claim 8, wherein said second transistor is a P-channel transistor and said first transistor is an N-channel transistor.

11. The method of claim 1, wherein forming said first recess comprises forming said first recess such that said first surface portion is substantially normal to a channel length of said transistor and said second surface portion is substantially parallel to said channel length of said transistor.

12. The method of claim 5, wherein modifying said exposed area comprises amorphizing a lattice structure of said at least one of a drain region and a source region at said first and second surface portions of said first recess, and wherein a depth of said amorphized lattice structure at said first surface portion is less than a depth of said amorphized lattice structure at said second surface portion.

13. A method, comprising:
 forming a first recess in at least one of a drain region and a source region of a transistor, said recess having a first surface portion that is substantially normal to a channel length of said transistor and second surface portion that is substantially parallel to said channel length of said transistor;
 forming a second recess in another of the drain region and the source region, said recess having a third surface portion that is substantially normal to a channel length of said transistor and fourth surface portion that is substantially parallel to said channel length of said transistor;
 performing an ion implantation process to modify an exposed area of said at least one of a drain region and a source region in said first recess and said another of the drain region and the source region in said second recess, wherein said ion implantation is performed asymmetrically with respect to said first recess and said second recess;
 forming a non-conformal refractory metal layer in said recesses;
 performing a heat treatment process to create non-conformal metal silicide layers within said recesses, wherein a thickness of said non-conformal metal silicide layer at said first surface portion is less than a thickness of said non-conformal metal silicide layer at said second surface portion and wherein a thickness of said non-conformal metal silicide layer at said third surface portion is less than a thickness of said non-conformal metal silicide layer at said fourth surface portion, wherein said thickness of said non-conformal metal silicide at said first surface portion is substantially different than said thickness of said non-conformal metal silicide at said third surface portion and said thickness of said non-conformal metal silicide at said second surface portion is substantially different than said thickness of said non-conformal metal silicide at said fourth surface portion; and
 forming a strain-inducing layer above said drain and source regions.

14. The method of claim 13, wherein forming said non-conformal refractory metal layer comprises forming a layer of refractory metal having a first thickness at said first surface portion and a second thickness at said second surface portion, wherein said first thickness is less than said second thickness.

15. The method of claim 14, wherein said first thickness is less than half of said second thickness.

\* \* \* \* \*